(12) United States Patent
Miyano et al.

(10) Patent No.: US 8,380,781 B2
(45) Date of Patent: Feb. 19, 2013

(54) SAMPLING FILTER AND RADIO COMMUNICATION APPARATUS

(75) Inventors: Kentaro Miyano, Osaka (JP);
Yoshifumi Hosokawa, Osaka (JP);
Yasuyuki Naito, Osaka (JP); Katsuaki Abe, Kanagawa (JP); Noriaki Saito, Tokyo (JP)

(73) Assignee: Panasonic Corporation, Osaka (JP)

( * ) Notice: Subject to any disclaimer, the term of this patent is extended or adjusted under 35 U.S.C. 154(b) by 1254 days.

(21) Appl. No.: 12/172,816

(22) Filed: Jul. 14, 2008

(65) Prior Publication Data

US 2009/0021296 A1 Jan. 22, 2009

(30) Foreign Application Priority Data

Jul. 18, 2007 (JP) .................................. 2007-187591
Jul. 2, 2008 (JP) .................................. 2008-173730

(51) Int. Cl.
*G06G 7/02* (2006.01)
(52) U.S. Cl. ....................................................... 708/819
(58) Field of Classification Search ........................ None
See application file for complete search history.

(56) References Cited

U.S. PATENT DOCUMENTS 6,301,965 B1 * 10/2001 Chu et al. .................... 73/514.18
7,057,540 B2    6/2006 Muhammad
8,078,128 B2 * 12/2011 Floyd ............................ 455/262
8,142,669 B2 *  3/2012 Akiba et al. ...................... 216/2

FOREIGN PATENT DOCUMENTS

JP    2004-289793    10/2004
JP    2008-80442     4/2008

OTHER PUBLICATIONS

Japanese Office Action dated Jun. 12, 2012.
A. Yoshizawa, "A Gain-Boosted Discrete-Time Charge-Domain FIR LPF with Double-Complementary MOS Parametric Amplifiers," ISSCC 2008 / Session 3 / Filters and Amplifiers / 3.2, 2008 IEEE International Solid-State Circuits Conference, Feb. 4, 2008, pp. 68-69, 596.

* cited by examiner

*Primary Examiner* — Tan V. Mai
(74) *Attorney, Agent, or Firm* — Dickinson Wright PLLC

(57) ABSTRACT

There are provided a sampling filter that enables a filter characteristic to be adjusted flexibly, and a radio communication apparatus equipped with this sampling filter. A sampling filter apparatus (100) is equipped with four integration units (150-1 through 150-4) corresponding to the number of filter taps, and some of the integration units (150-1 through 150-4) include an integrator having an MEMS structure. By this means, a charge amount (accumulated charge amount) of a received signal integrated by an integrator can be adjusted by adjusting the capacity of an integrator having an MEMS structure. A received signal amount emitted from an integration unit can also be adjusted by adjustment of the integration amount of a received signal, enabling the filter characteristic of the sampling filter apparatus (100) to be adjusted flexibly.

8 Claims, 16 Drawing Sheets

| | FIRST INTEGRATION UNIT SET | | | SECOND INTEGRATION UNIT SET | | | | THIRD INTEGRATION UNIT SET | | | | FOURTH INTEGRATION UNIT SET | | | | FIFTH INTEGRATION UNIT SET | | | |
|---|---|---|---|---|---|---|---|---|---|---|---|---|---|---|---|---|---|---|---|
| | 1500 | 1501 | 1502 | 1503 | 1520 | 1521 | 1522 | 1523 | 1540 | 1541 | 1542 | 1543 | 1560 | 1561 | 1562 | 1563 | 1580 | 1581 | 1582 | 1583 |
| TIMING 1 | ○ | | | | | ○ | | | | | ○ | | | | | ○ | | | | |
| TIMING 2 | | ○ | | | | | ○ | | | | | ○ | | | | | ○ | | | |
| TIMING 3 | | | ○ | | | | | ○ | | | | | ○ | | | | | ○ | | |
| TIMING 4 | | | | ○ | | | | | ○ | | | | | ○ | | | | | ○ | |
| TIMING 5 | | | | | ○ | | | | | ○ | | | | | ○ | | | | | ○ |
| TIMING 6 | ○ | | | | | ○ | | | | | ○ | | | | | ○ | ○ | | | |
| TIMING 7 | | ○ | | | | | ○ | | | | | ○ | | | | | | ○ | | |
| TIMING 8 | | | ○ | | | | | ○ | | | | | ○ | | | | | | ○ | |
| TIMING 9 | | | | | | | | | | | | | | ○ | | | | | | |
| TIMING 10 | | | | | ○ | | | | | ○ | | | | | ○ | | | | | ○ |

FIG.16

SAMPLING FILTER AND RADIO COMMUNICATION APPARATUS

CROSS REFERENCE TO RELATED APPLICATIONS

The disclosure of Japanese Patent Application No. 2007-187591 filed on Jul. 18, 2007 and Japanese Patent Application No. 2008-173730 filed on Jul. 2, 2008 including the specification, drawings and abstract is incorporated herein by reference in its entirety.

BACKGROUND OF THE INVENTION

1. Field of the Invention

The present invention relates to a sampling filter and radio communication apparatus, and more particularly to a sampling filter and radio communication apparatus that perform frequency conversion, filter processing, and so forth, by means of analog processing.

2. Description of the Related Art

In a mobile communication or suchlike radio communication apparatus, a sampling filter apparatus is used that temporally discretizes a signal and performs frequency conversion and filtering. An example of a conventional sampling filter apparatus is that shown in Unexamined Japanese Patent Publication No. 2004-289793 (page 16, FIG. 3b). FIG. 1 shows the conventional sampling filter apparatus presented in Patent Document 1.

As shown in FIG. 1, conventional sampling filter apparatus 10 has transconductance amplifier 20 and sampling circuit 30. This sampling circuit 30 has history capacitor 32, sampling capacitors 34 and 36, and switch 38. Sampling capacitors 34 and 36 are banks of rotation capacitors 42, and also have switches 44 and 46.

Transconductance amplifier 20 supplies a radio frequency (RF) current to sampling circuit 30. The RF current is integrated by history capacitor 32—that is, a charge is accumulated on history capacitor 32. The RF current flow to history capacitor 32 is controlled by switch 38. Switch 38 is controlled by a signal generated by a digital control unit (DCU).

RF current is also supplied to rotation capacitor 42. When switch 44 is turned on a charge is accumulated on rotation capacitor 42, and when switch 46 is turned on an already accumulated charge is read. Switch 44 and switch 46 are also controlled by a signal generated by a digital control unit (DCU).

With a conventional sampling filter having this kind of configuration, a discrete time sample stream can be created by cyclically reading charges accumulated in rotation capacitors 42.

SUMMARY OF THE INVENTION

However, with an above-described conventional sampling filter, the rotation capacitor capacity is fixed, and therefore a filter characteristic cannot be adjusted flexibly.

It is an object of the present invention to provide a sampling filter that enables a filter characteristic to be adjusted flexibly, and a radio communication apparatus equipped with this sampling filter.

A sampling filter of the present invention implements an m-tap (where m is a natural number) FIR filter characteristic by having a received signal as input, and integrating and emitting an input received signal, and employs a configuration that includes m integration units corresponding to the m taps, and wherein at least some of the m integration units include an integrator having an MEMS (Micro Electro Mechanical Systems) structure.

According to the present invention, a sampling filter that enables a filter characteristic to be adjusted flexibly, and a radio communication apparatus equipped with this sampling filter, can be provided.

BRIEF DESCRIPTION OF THE DRAWINGS

FIG. 16 is a drawing showing charge timings for the capacitors in FIG. 14;

DETAILED DESCRIPTION OF THE PREFERRED EMBODIMENTS

With reference now to the accompanying drawings, embodiments of the present invention will be explained in detail below. In the embodiments, identical configuration elements are assigned the same reference codes, and duplicate descriptions thereof are omitted.

Embodiment 1

Figure 1:
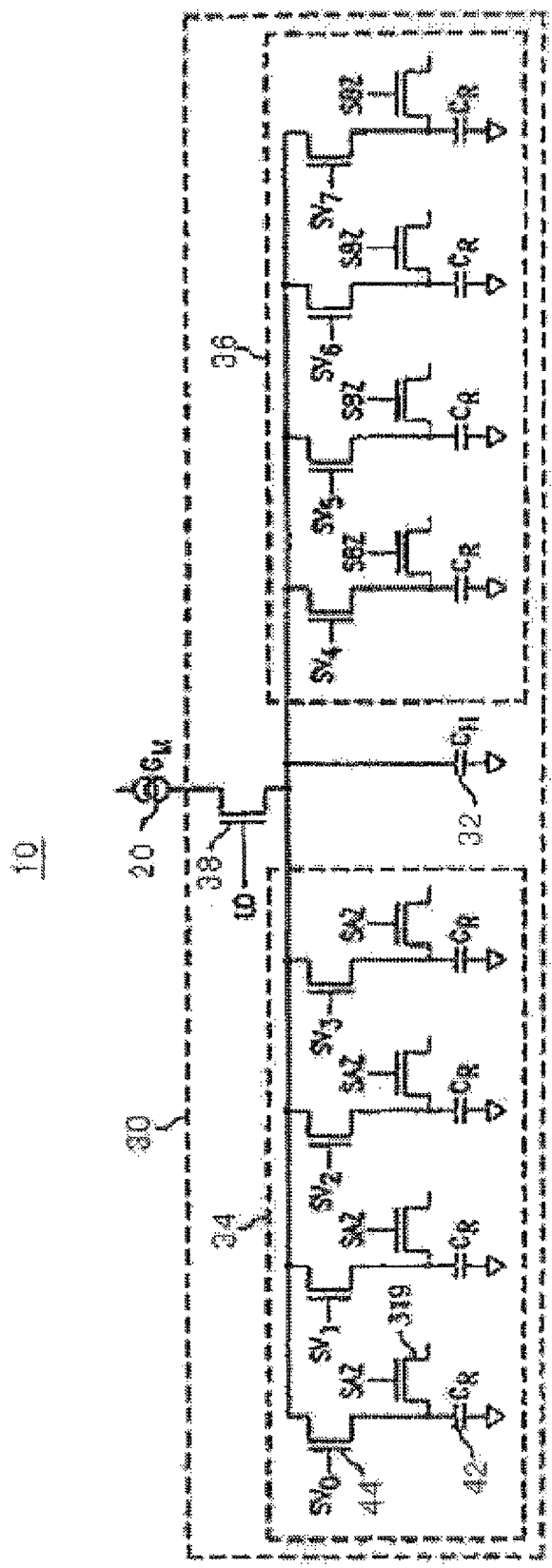
FIG. 1 is a drawing showing the configuration of a conventional sampling filter apparatus.
Figure 2:
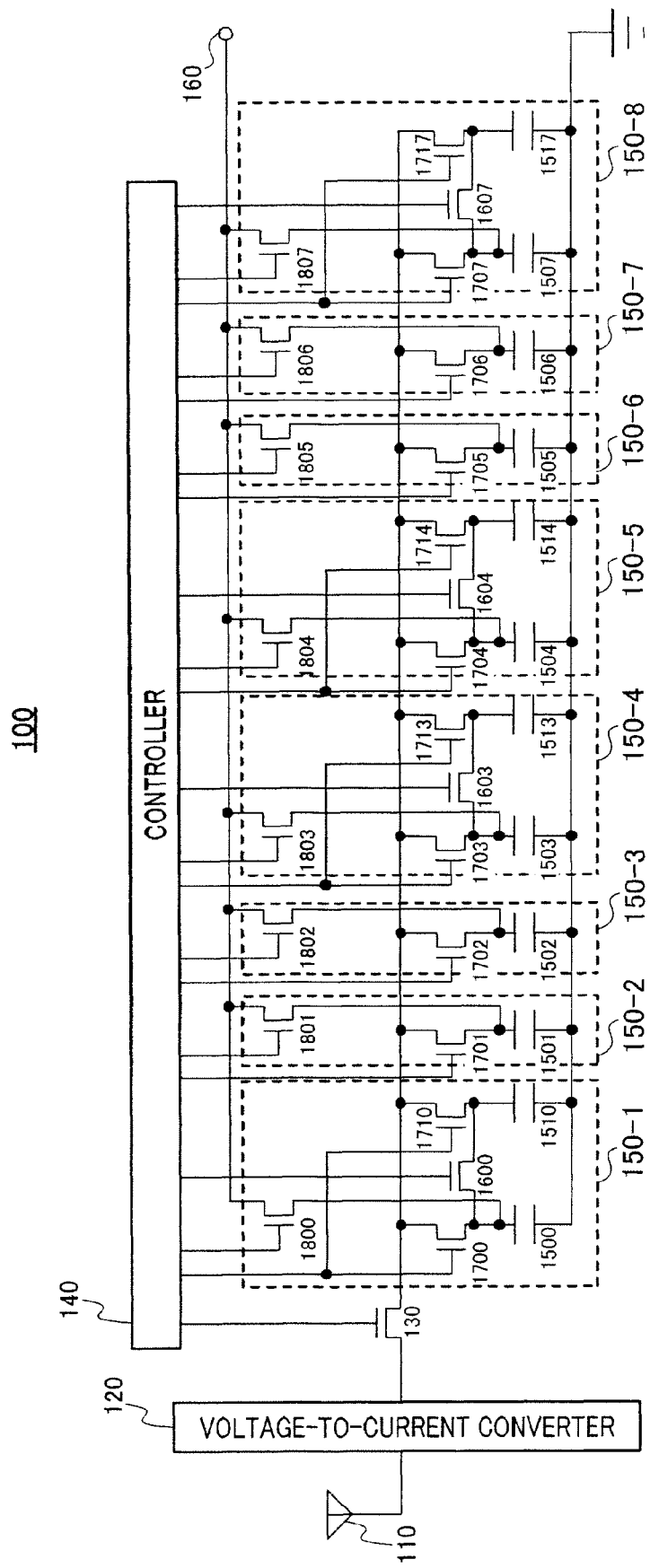
FIG. 2 is a block diagram showing the configuration of a sampling filter apparatus according to Embodiment 1 of the present invention.

FIG. 2 shows the configuration of a sampling filter apparatus according to this embodiment. In FIG. 2, the configuration of a sampling filter apparatus having a 4-tap FIR filter characteristic is shown.

Sampling filter apparatus 100 has antenna 110, voltage-to-current converter 120, sampling switch 130, controller 140, and integration units 150-1 through 150-8. The number of integration units 150 included in sampling filter apparatus 100 is twice the number of taps. Integration units 150-1 through 150-4 form one set, and integration units 150-5 through 150-8 form another set. That is to say, sampling filter apparatus 100 has two sets of integration units, the number of integration units in each set being the same as the number of taps. Integration units 150-1 through 150-8 execute discrete time analog processing. In FIG. 2, terminal 160 connected to circuitry subsequent to sampling filter apparatus 100 is also shown.

Antenna 110 receives a radio frequency signal transmitted from a transmitting station (not shown). A radio frequency signal received by antenna 110 undergoes predetermined high-frequency signal processing by means of a filter (not shown), for example, and a received signal having undergone that processing is input to voltage-to-current converter 120.

Voltage-to-current converter 120 converts a post-high-frequency-signal-processing received signal (voltage) to a current, and outputs this to sampling switch 130. Voltage-to-current converter 120 is a transconductance amplifier (TA), for example.

Sampling switch 130 samples the input current based on a control signal received from controller 140, and supplies the sampled signal to integration units 150-1 through 150-8.

Controller 140 generates and supplies control signals to integration units 150-1 through 150-8 and sampling switch 130.

Integration units 150-1 through 150-8 are divided into two groups according to their configuration. The first group comprises integration units 150-1, 150-4, 150-5, and 150-8, and the second group comprises integration units 150-2, 150-3, 150-6, and 150-7.

Integration unit 150-1 belonging to the first group has two capacitors 1500 and 1510, charge transfer switch 1600 that switches a conduction state between capacitor 1500 and capacitor 1510, two charge switches 1700 and 1710, and one discharge switch 1800. At least one or other of capacitor 1500 and/or capacitor 1510 has an MEMS (Micro Electro Mechanical Systems) structure. Integration units 150-4, 150-5, and 150-8 belonging to the same first group also have the same basic configuration as integration unit 150-1, and below, capacitors 1500, 1503, 1504, and 1507 will be described as having an MEMS structure.

Integration unit 150-2 belonging to the second group has capacitor 1501, charge switch 1701, and discharge switch 1801. Integration units 150-3, 150-6, and 150-7 belonging to the same second group also have the same basic configuration as integration unit 150-2.

Figure 3:
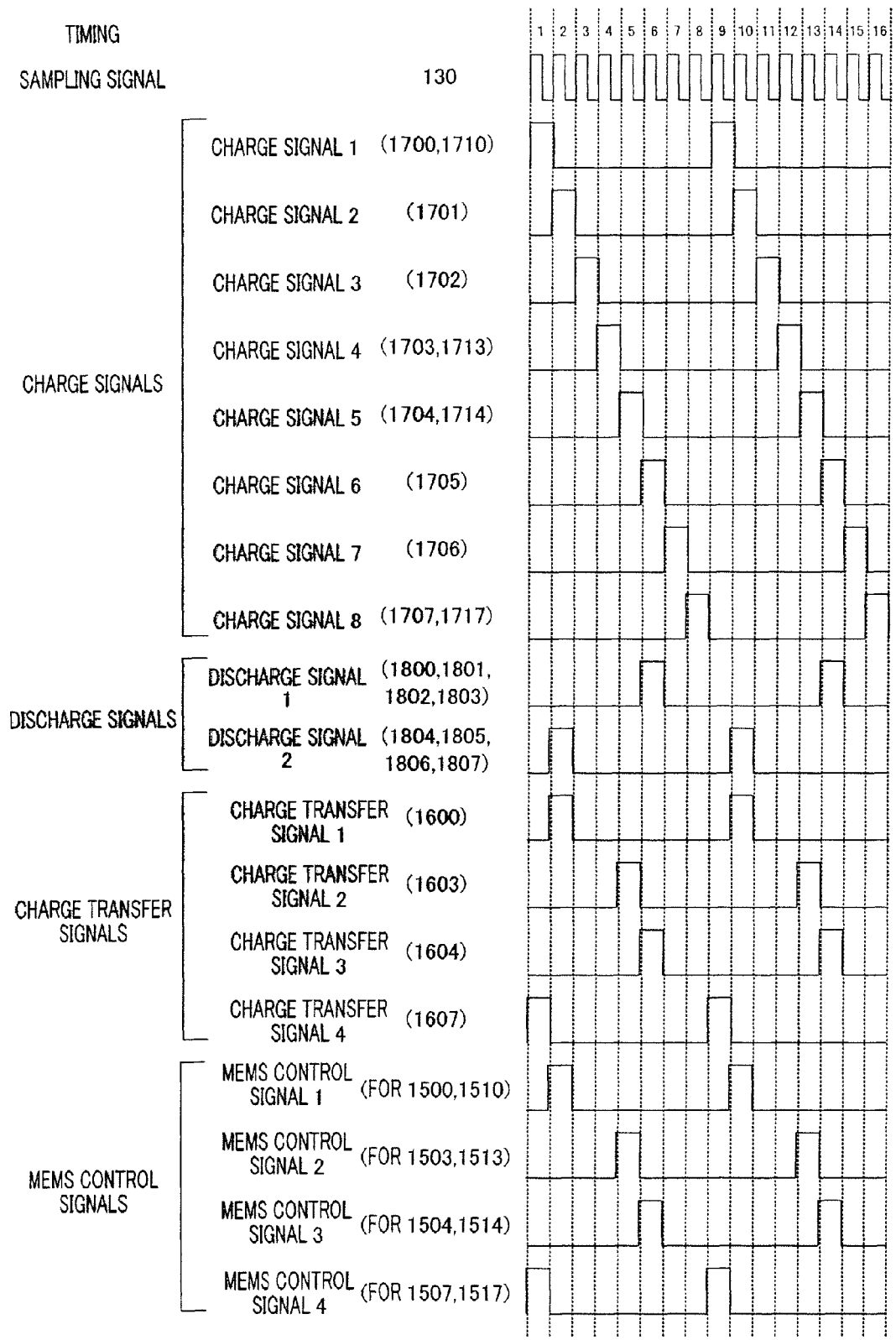
FIG. 3 is a timing chart of control signals generated by the controller in FIG. 2.

FIG. 3 is a timing chart of control signals generated by controller 140. A sampling signal is supplied to sampling switch 130. Charge signals 1 through 8 are supplied to charge switches 1700 through 1707, 1710, 1713, 1714, and 1717, respectively. Discharge signal 1 is supplied to discharge switches 1800 through 1803. Discharge signal 2 is supplied to discharge switches 1804 through 1807. Charge transfer signals 1 through 4 are supplied to charge transfer switches 1600, 1603, 1604, and 1607, respectively. MEMS control signals 1 through 4 are supplied to integration units 150-1, 150-4, 150-5, and 150-8, respectively.

The operation of the sampling filter apparatus shown in FIG. 2 will now be described.

Voltage-to-current converter 120 converts an input voltage signal to a current signal, and outputs this current signal to sampling switch 130. The current signal is sampled by sampling switch 130 based on a sampling signal, and is accumulated in integration units 150-1 through 150-8.

Specifically, first, charge switches 1700 and 1710 are turned on by charge signal 1, sampling switch 130 is turned on by a sampling signal while charge signal 1 is high, and a charge is integrated by two capacitors 1500 and 1510 during the period in which the sampling signal is high. At this timing, the capacity values of capacitors 1500 and 1510 are the same.

When charge signal 1 goes low, charge switches 1700 and 1710 are turned off, and charge switch 1701 is turned on by charge signal 2. While charge signal 2 is high, sampling switch 130 is turned on by a sampling signal, and a charge is accumulated by capacitor 1501 during the period in which the sampling signal is high. In a similar way, capacitors 1501 through 1507, 1513, 1514, and 1517 integrate charges in sequential order every 8 sampling signal cycles by means of charge signals 3 through 8.

When charge signal 1 goes low and charge signal 2 goes high, charge transfer processing is performed by integration unit 150-1. That is to say, when charge transfer signal 1 and MEMS control signal 1 go high after charge signal 1 goes low, charge transfer switch 1600 is turned on and the capacity value of capacitor 1500 having an MEMS structure changes. Sampling filter apparatus 100 can be given a low-pass filter characteristic by making the capacity value of capacitor 1500 smaller.

Since charge signal 1 is low when charge signal 2 is high, charge switches 1700 and 1710 are both off at this time. By this means, transfer of charges accumulated by capacitors 1500 and 1510 is limited to transfer between the two capacitors. Thus, when charge transfer switch 1600 is turned on and the capacity value of capacitor 1500 decreases due to an MEMS control signal, part of the charge accumulated by capacitor 1500 is transferred to capacitor 1510. Similarly, when charge signal 4 goes low and charge signal 5 goes high, charge transfer processing is performed by integration unit 150-4.

When discharge signal 1 also goes high at the timing at which charge signal 6 goes high, discharge switches 1800 through 1803 of integration units 150-1 through 150-4 are turned on. As charge transfer switches 1600 and 1603 are off at the timing at which discharge signal 1 goes high, charges accumulated by capacitors 1510 and 1513 (including a charge transferred by charge transfer processing) are not emitted. Therefore, when discharge signal 1 goes high, charges accumulated by capacitors 1500 through 1503 at this timing are emitted. Emission of charges for integration unit 150-5 through integration unit 150-8 is performed at the timing at which discharge signal 2 goes high. The timing at which discharge signal 2 goes high coincides with the timing at which charge signal 2 goes high.

Next, the operation of the sampling filter apparatus shown in FIG. 2 will be described in detail, considering the charge amount accumulated by the capacitors.

When the operating frequency of sampling switch 130 is 1/T [Hz], timing 1 in FIG. 3 indicates a period of 0 to T [s], timing 2 a period of T to 2T [s], and timing L a period of (L−1)×T to L×T [s]. It is assumed here that capacitors 1501, 1502, 1505, and 1506 have the same capacity (=$C_1$), and capacitors 1500, 1510, 1503, 1513, 1504, 1514, 1507, and 1517 have the same capacity (=$C_1/2$).

At timing 1, charge switches 1700 and 1710 of integration unit 150-1 are turned on. When sampling switch 130 is turned on at this time, voltage-to-current converter 120, capacitor 1500, and capacitor 1510 are connected. A charge ($Q_{120}^1$) is then input from voltage-to-current converter 120 to capacitor 1500 and capacitor 1510. Then a $\tfrac{1}{2} \times Q_{120}^1$ charge is charged in capacitor 1500, and a $\tfrac{1}{2} \times Q_{120}^1$ charge is also charged in capacitor 1510.

Also, at timing 1, charge transfer switch 1607 of integration unit 150-8 is turned on, the capacity value of capacitor 1507 decreases based on MEMS control signal 4, and transfer processing of an already accumulated charge is performed between capacitor 1507 and capacitor 1517.

At timing 2, charge switch 1701 of integration unit 150-2 is turned on. When sampling switch 130 is turned on at this time, voltage-to-current converter 120 and capacitor 1501 are connected. A charge ($Q_{120}^2$) is then input from voltage-to-current converter 120 to capacitor 1501. At this time, a $Q_{120}^2$ charge is charged in capacitor 1501.

Also, at timing 2, charge transfer switch 1600 of integration unit 150-1 is turned on, the capacity value of capacitor 1500 decreases based on MEMS control signal 1, and transfer processing of an already accumulated charge is performed between capacitor 1500 and capacitor 1510. Also, discharge switches 1804, 1805, 1806, and 1807 are turned on. By this means, charges charged in capacitors 1504, 1505, 1506, and 1507 in integration units 150-5 through 150-8 are emitted.

At timing 3, charge switch 1702 of integration unit 150-3 is turned on. When sampling switch 130 is turned on at this time, voltage-to-current converter 120 and capacitor 1502 are connected. A charge ($Q_{120}^3$) is then input from voltage-to-current converter 120 to capacitor 1502. At this time, a $Q_{120}^3$ charge is charged in capacitor 1502.

At timing 4, charge switches 1703 and 1713 of integration unit 150-4 are turned on. When sampling switch 130 is turned on at this time, voltage-to-current converter 120, capacitor 1503, and capacitor 1513 are connected. A charge ($Q_{120}^4$) is then input from voltage-to-current converter 120 to capacitor 1503 and capacitor 1513. Then a $\frac{1}{2} \times Q_{120}^4$ charge is charged in capacitor 1503, and a $\frac{1}{2} \times Q_{120}^4$ charge is also charged in capacitor 1513.

At timing 5, charge switches 1704 and 1714 of integration unit 150-5 are turned on. When sampling switch 130 is turned on at this time, voltage-to-current converter 120, capacitor 1504, and capacitor 1514 are connected. A charge ($Q_{120}^5$) is then input from voltage-to-current converter 120 to capacitor 1504 and capacitor 1514. Then a $\frac{1}{2} \times Q_{120}^5$ charge is charged in capacitor 1504, and a $\frac{1}{2} \times Q_{120}^5$ charge is also charged in capacitor 1514.

Also, at timing 5, charge transfer switch 1603 of integration unit 150-4 is turned on, the capacity value of capacitor 1503 decreases based on MEMS control signal 2, and transfer processing of an already accumulated charge is performed between capacitor 1503 and capacitor 1513.

At timing 6, charge switch 1705 of integration unit 150-6 is turned on. When sampling switch 130 is turned on at this time, voltage-to-current converter 120 and capacitor 1505 are connected. A charge ($Q_{120}^6$) is then input from voltage-to-current converter 120 to capacitor 1505. At this time, a $Q_{120}^6$ charge is charged in capacitor 1505.

Also, at timing 6, charge transfer switch 1604 of integration unit 150-5 is turned on, the capacity value of capacitor 1504 decreases based on MEMS control signal 3, and transfer processing of an already accumulated charge is performed between capacitor 1504 and capacitor 1514. Also, discharge switches 1800, 1801, 1802, and 1803 are turned on. By this means, charges charged in capacitors 1500, 1501, 1502, and 1503 in integration units 150-1 through 150-4 are emitted.

At timing 7, charge switch 1706 of integration unit 150-7 is turned on. When sampling switch 130 is turned on at this time, voltage-to-current converter 120 and capacitor 1506 are connected. A charge ($Q_{120}^7$) is then input from voltage-to-current converter 120 to capacitor 1506. Then a $Q_{120}^7$ charge is charged in capacitor 1506.

At timing 8, charge switches 1707 and 1717 of integration unit 150-8 are turned on. When sampling switch 130 is turned on at this time, voltage-to-current converter 120, capacitor 1507, and capacitor 1517 are connected. A charge ($Q_{120}^8$) is then input from voltage-to-current converter 120 to capacitor 1507 and capacitor 1517. Then a $\frac{1}{2} \times Q_{120}^7$ charge is charged in capacitor 1507, and a $\frac{1}{2} \times Q_{120}^8$ charge is also charged in capacitor 1517.

At timing 9 onward, the processing of timings 1 through 8 is repeated.

Here, it is assumed that a charge charged in capacitors 1500, 1503, 1504, and 1507 after integration unit 150-1, 150-4, 150-5, and 150-8 charge transfer processing is $a \times Q_{120}^x$. The transfer function of sampling filter apparatus 100 at this time is represented by Equation (1) below.

[1]
$$y = a + z^{-1} + z^{-2} + a z^{-3} \quad \text{(Equation 1)}$$

The zero-order through third-order coefficients on the right side of Equation (1) correspond to charge amounts emitted from integration units 150-1 through 150-4 (integration units 150-5 through 150-8) respectively.

Figure 4:
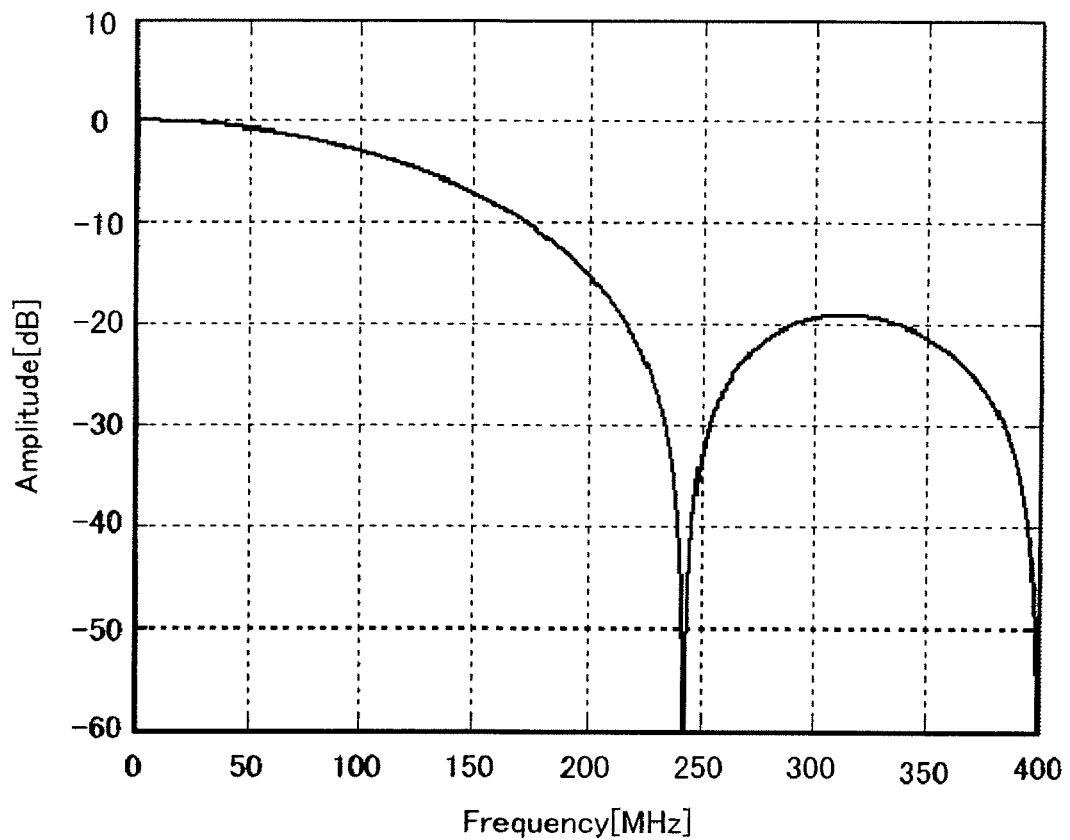
FIG. 4 is a graph showing a filter characteristic implemented by the sampling filter apparatus in FIG. 2.

In FIG. 4, an example of a filter characteristic is shown by the solid line. Specifically, a filter characteristic when 1/T is 800 [MHz] and a is 0.6 is shown.

From the above, when the charge transfer amount is changed, a changes. That is to say, it is possible to change the filter characteristic by changing the charge transfer amount. The charge transfer amount can be changed by adjusting MEMS control to adjust the capacity ratio between capacitors connected in parallel. If the dynamic range of the voltage-to-current converter is wide, the charge amount charged in a capacitor can be changed by switching the internal voltage of the voltage-to-current converter. By this means, the filter characteristic can be further changed.

Figure 12:
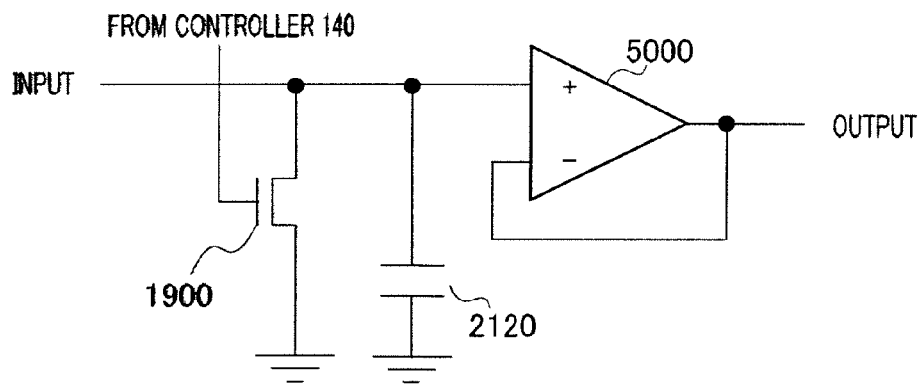
FIG. 12 is a drawing showing the configuration of the Buffer in FIG. 11.

After discharging, it is necessary to reset the charge of each capacitor. Specifically, a reset switch is connected in parallel to a capacitor, as shown in FIG. 12, and the charge accumulated in the capacitor is zeroized by turning on the reset switch after the discharge signal changes from the on to off state.

Next, charge transfer processing performed by integration units 150-1, 150-4, 150-5, and 150-8 will be described in detail. Examples of a method of transferring a charge using an MEMS structure are given below. FIG. 5 through FIG. 8 are perspective views showing integration unit configurations corresponding to the respective examples. The integration unit shown in these drawings is described as integration unit 150-1.

Example 1

Figure 5:
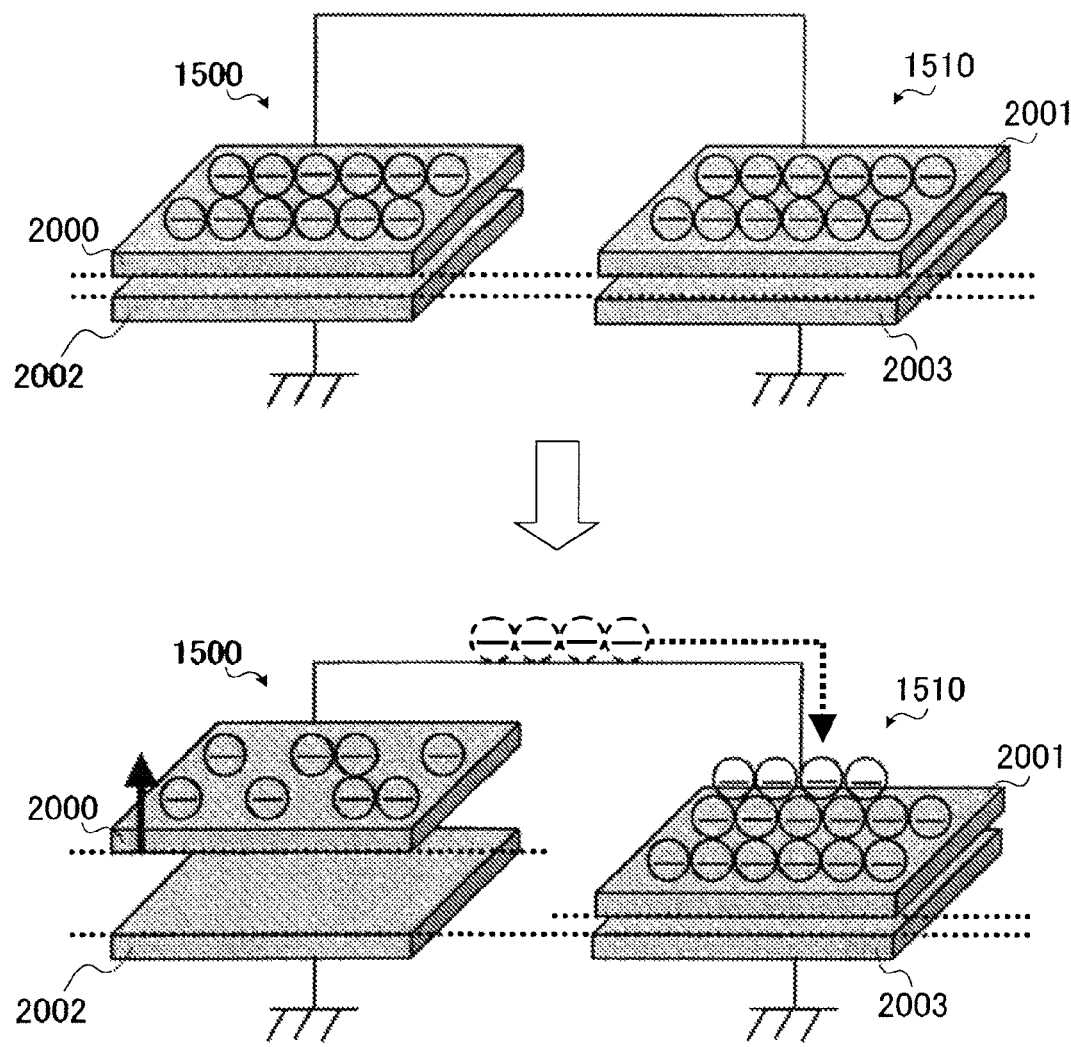
FIG. 5 is a drawing provided to explain a method of moving a charge with a capacitor having an MEMS structure.

Integration unit 150-1 shown in FIG. 5 is formed on a substrate and circuit. Capacitor 1500 has an MEMS structure suspended in space to enable an electrode to be moved by means of an external force such as electrostatic force. Capacitor 1500 has two electrodes facing each other. At least one of these two electrodes, electrode 2000, is movable via an MEMS structure, while electrode 2002 is fixed. In this description, capacitor 1510 is assumed not to have an MEMS structure, and therefore electrodes 2001 and 2003 are fixed.

The capacitance of a capacitor can generally be expressed as $C = e(S/d)$, where e is permittivity between the electrodes, S is the facing area of the electrodes, and d is the distance between the electrodes.

That is to say, as can be seen from the above equation, capacitance C can be changed by making facing area S and distance between electrodes d variable by displacing electrodes 2000 and 2001. A capacitor of this embodiment is an MEMS variable-capacity element. After two capacitors are charged, it is possible to change the capacitance and transfer a charge between the capacitors.

In integration unit 150-1 charge transfer processing, first, when capacitors 1500 and 1510 are charged, both capacitors are in a state with an equal facing area S and distance between electrodes d. That is to say, capacitance C and charge Q are the same for both capacitors 1500 and 1510.

Then, when transferring a charge, electrode 2000 of capacitor 1500 is displaced, and the distance between electrodes is increased to d'. Together with this, the capacitance of capacitor 1500 decreases to C'. To the extent to which its capacitance decreases, capacitor 1500 is no longer able to hold charge amount Q, and its charge amount decreases to Q' by discharging a charge to the other capacitor 1510. The discharged charge is accumulated in the other capacitor 1510. By this means, the charge amount of capacitor 1510 increases to Q''. The charge amount states of capacitors 1500 and 1510 change from Q for both to Q' and Q'' respectively (where Q'<Q'').

That is to say, a charge can be transferred between the two capacitors by performing received signal integration in a state in which the capacity values of capacitor 1500 and capacitor 1510 are the same, and then disrupting the balance of the capacity values of the two capacitors.

If capacitor 1510 also has an MEMS structure, the charge transfer amount can be increased by reducing the distance between the electrodes of capacitor 1510, thereby increasing its capacity value.

Example 2

Figure 6:
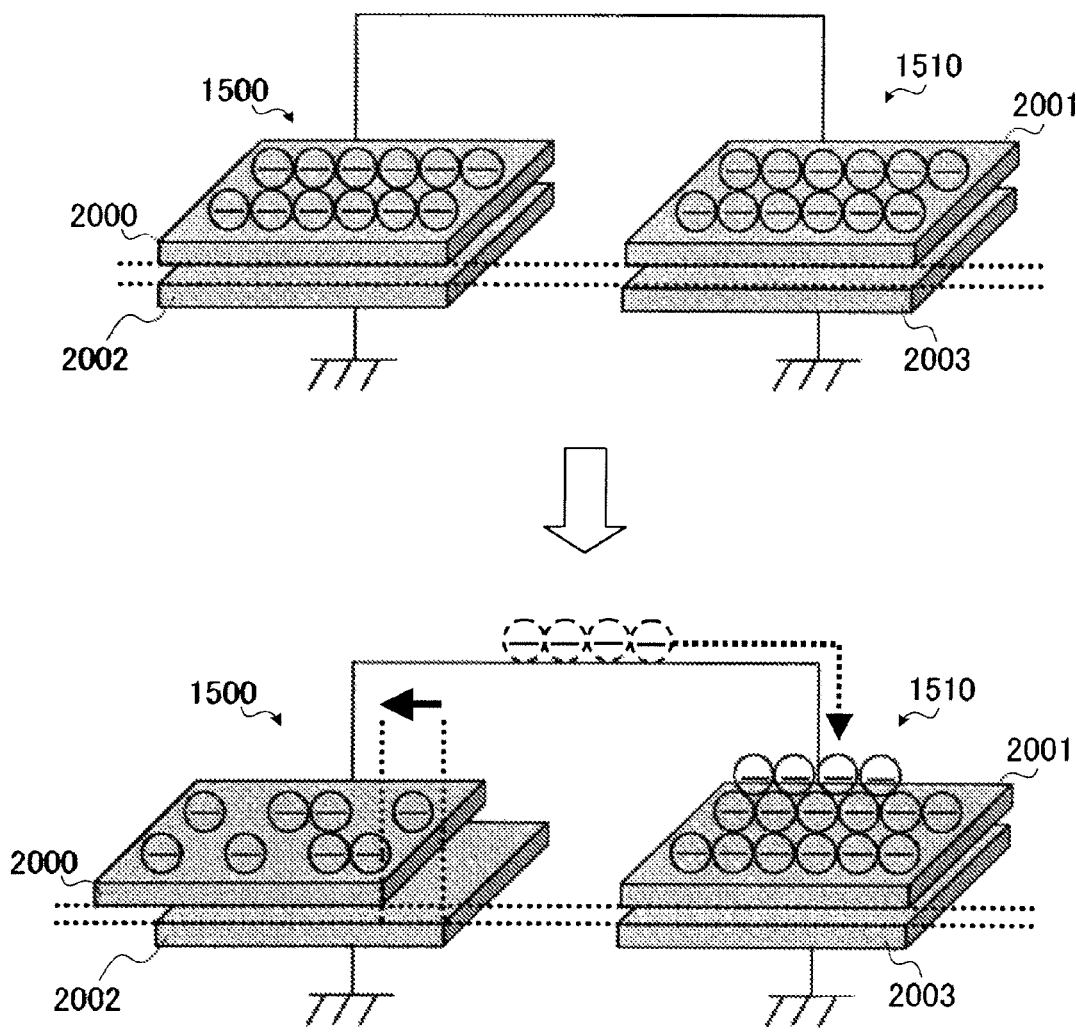
FIG. 6 is a drawing provided to explain a method of moving a charge with a capacitor having an MEMS structure.

FIG. 6 shows an integration unit in a case in which the facing area of electrodes is changed by means of an MEMS structure. In integration unit 150-1, one electrode 2000 of capacitor 1500 is displaced, decreasing the facing area of the two electrodes from S to S'. The capacitance of capacitor 1500 then decreases from Q to Q'. A charge can be transferred between the two capacitors by disrupting the balance of the capacity values of capacitor 1500 and capacitor 1510 in this way.

Example 3

Figure 7:
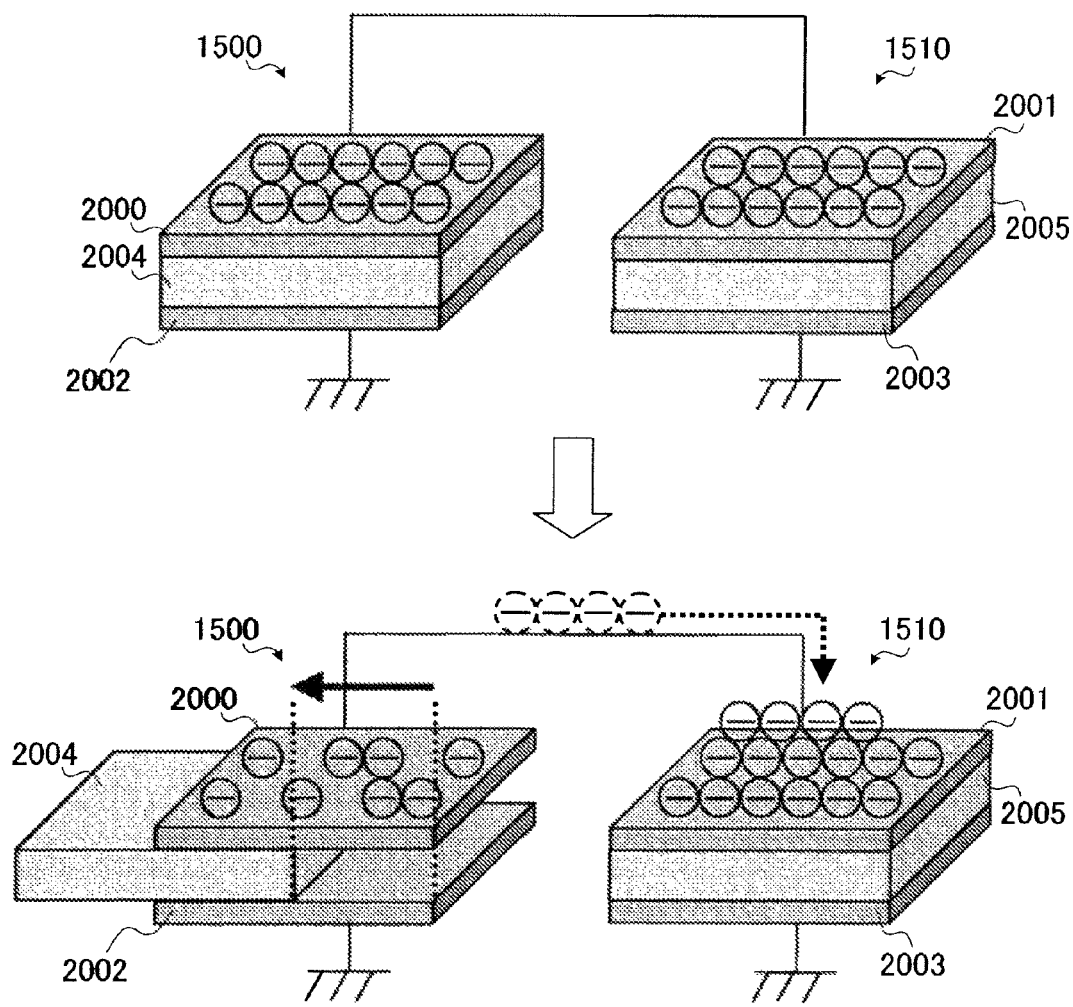
FIG. 7 is a drawing provided to explain a method of moving a charge with a capacitor having an MEMS structure.

FIG. 7 shows an integration unit in a case in which the range between electrodes occupied by a dielectric positioned between the electrodes is changed by means of an MEMS structure. As shown in FIG. 7, dielectric 2004 is positioned between the two electrodes of capacitor 1500, and dielectric 2005 is positioned between the two electrodes of capacitor 1510. In integration unit 150-1, the facing area occupied by dielectric 2004 positioned between the two electrodes of capacitor 1500 is decreased by withdrawing dielectric 2004 from between the electrodes. The capacitance of capacitor 1500 then decreases from Q to Q'. A charge can be transferred between the two capacitors by disrupting the balance of the capacity values of capacitor 1500 and capacitor 1510 in this way.

Example 4

Figure 8:
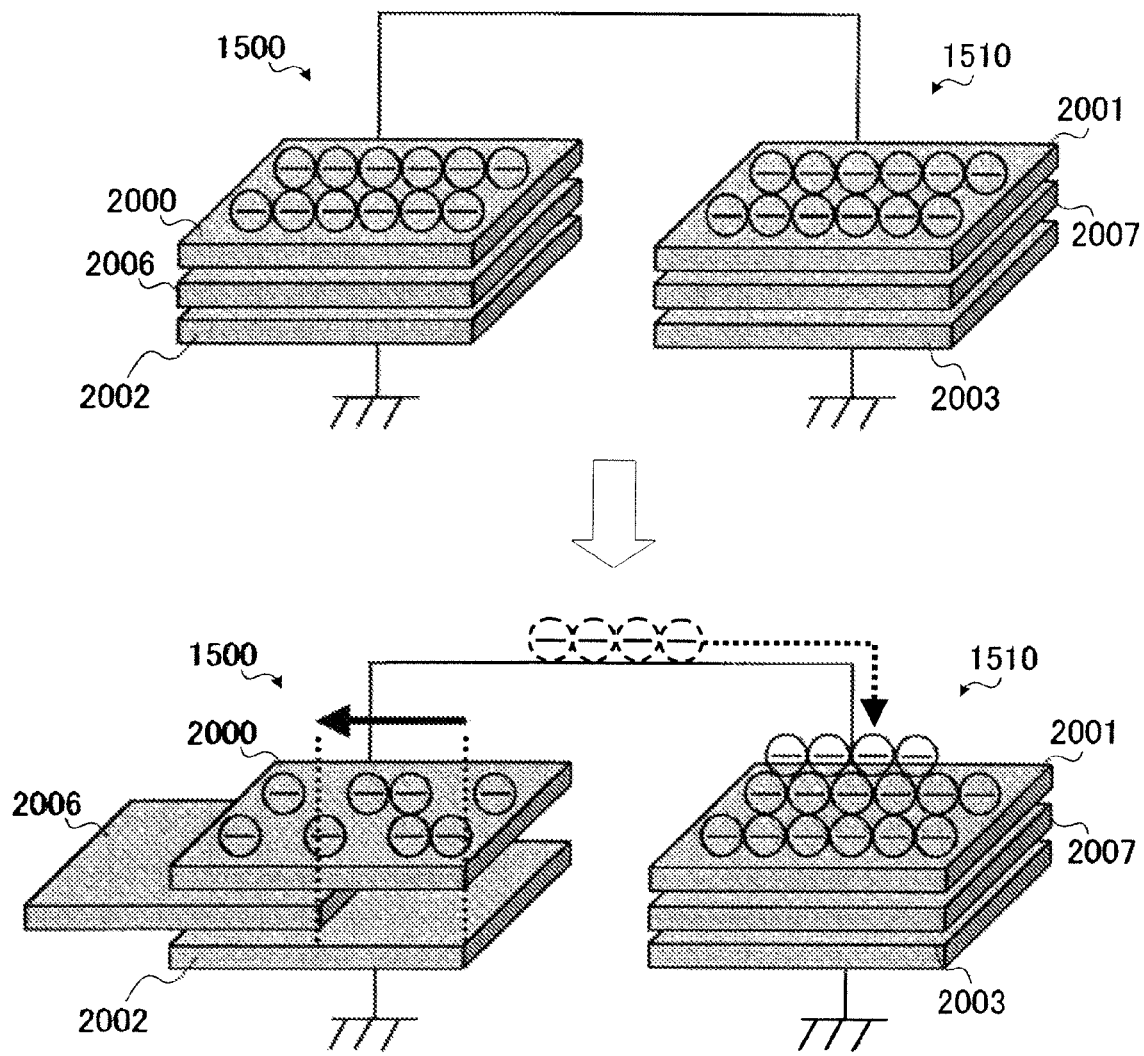
FIG. 8 is a drawing provided to explain a method of moving a charge with a capacitor having an MEMS structure.

FIG. 8 shows an integration unit in a case in which another electrode is inserted between two electrodes, and the range between electrodes occupied by the inserted electrode is changed by means of an MEMS structure. As shown in FIG. 8, another electrode 2006 is inserted between the two electrodes (electrodes 2000 and 2002) of capacitor 1500, and another electrode 2007 is inserted between the two electrodes (electrodes 2001 and 2003) of capacitor 1510. In integration unit 150-1, the facing area occupied by other electrode 2006 positioned between the two electrodes (electrodes 2000 and 2002) of capacitor 1500 is decreased by withdrawing electrode 2006 from those electrodes (electrodes 2000 and 2002). The capacitance of capacitor 1500 then decreases from Q to Q'. A charge can be transferred between the capacitors by disrupting the balance of the capacity values of capacitor 1500 and capacitor 1510 in this way.

Also, 1/0 capacitance changing can be implemented by switching between states in which parallel plates are in contact and separated using an MEMS structure. It is possible to obtain a large charge gradient between capacitors in this way.

As described above, according to this embodiment, sampling filter apparatus 100 employs a configuration that includes four integration units 150-1 through 150-4 corresponding to the number of filter taps, and wherein at least some of integration units 150-1 through 150-4 include a capacitor having an MEMS structure. Since received signal integration and emission cannot be performed simultaneously in one integration unit, sampling filter apparatus 100 has a set of integration units comprising integration units 150-5 through 150-8 in addition to a set of integration units comprising integration units 150-1 through 150-4.

By this means, since a charge amount accumulated in a capacitor can be changed by adjusting the capacity of a capacitor having an MEMS structure, the degree of freedom of sampling filter apparatus 100 filter characteristic change can be increased.

Specifically, one of integration units 150-1 through 150-4—for example, integration unit 150-1—has capacitor 1500 having an MEMS structure and capacitor 1510 connected in parallel to that capacitor 1500. Then the charge amount accumulated in each capacitor can be adjusted by adjusting the capacity of capacitor 1500 and transferring charges accumulated in capacitor 1500 and capacitor 1510 between the two capacitors. An external force such as an electrostatic force used when transferring a capacitor charge has an effect on charge transfer. However, a desired charge transfer can be implemented by estimating that effect before hand. Also, a configuration can be used that provides isolation so as to prevent an external force such as an electrostatic force from affecting a charge.

Capacitor 1500 has here been assumed to be the capacitor that emits an integrated received signal, but capacitor 1510 may also be the emitting capacitor.

Capacitor 1500 has been assumed to have an MEMS structure, but capacitor 1510 may have an MEMS structure instead, or both capacitors may have an MEMS structure. The essential point is that a charge amount emitted should be able to be adjusted by transferring an accumulated charge between the two capacitors by disrupting the balance of the capacities of the two capacitors using an MEMS structure.

Integration units having an MEMS structure according to this embodiment have been assumed to be integration units 150-1 and 150-4 at either end in each set, but it is also possible to use integration units 150-2 and 150-3 that are not integration units at either end in each set, and adjust a FIR filter characteristic by emitting an integrated signal from a capacitor whose charge has been increased by charge transfer processing. That is to say, with regard to the arrangement of capacitors having an MEMS structure, a filter characteristic can be adjusted by giving each set a laterally symmetrical structure.

In the above description it has been assumed that integration processing is performed in sequential order from integration unit 150-1 through integration unit 150-8, and therefore each set has a laterally symmetrical structure. However, as long as the input control signal is the same, the location of an integration unit having an MEMS structure does not particularly matter. When the number of FIR filter characteristic taps implemented by a sampling filter apparatus is designated m, it is sufficient for an integration unit corresponding to k taps (where k is a natural number satisfying the condition 1=k=m) for which weighting is deemed necessary to include a capacitor having an MEMS structure.

That is to say, a capacitor having an MEMS structure is provided in a plurality of integration units in a symmetrical sequential order when the middle of a sequence that stipulates a sequential order in which a plurality of integration units in the same set integrate a received signal is assumed to be the symmetry center. Or, from a different perspective, the processing flow for integration processing and charge transfer processing in each set is a processing flow in which a processing step for a first-half tap and a processing step for a second-half tap are symmetrical with respect to their mutual boundary. Or, from yet another perspective, an integration unit corresponding to the k-order term (where k is a natural number satisfying the condition 0=k=m−1) in a filter characteristic transfer function includes a capacitor having an MEMS structure, assuming that the filter characteristic transfer function is expressed as the sum of 0-order to (m−1)-order terms.

Embodiment 2

Figure 9:
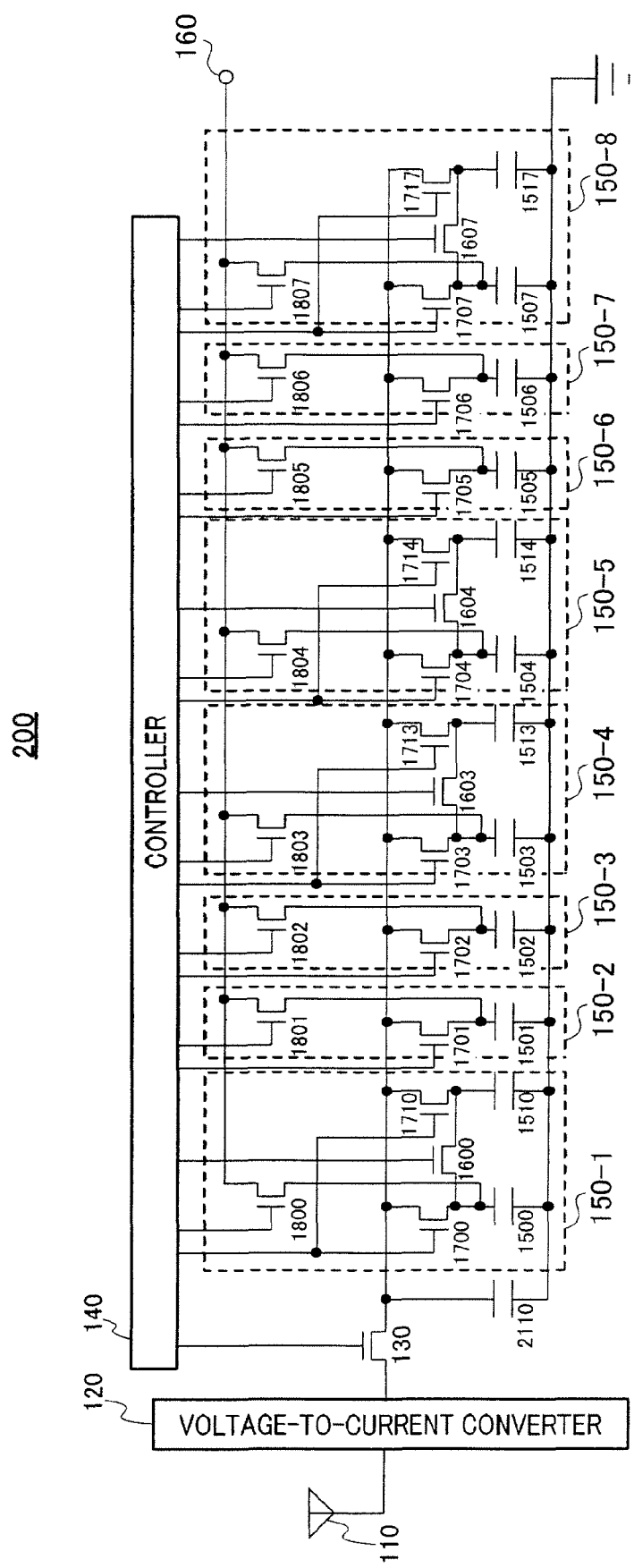
FIG. 9 is a block diagram showing the configuration of a sampling filter apparatus of Embodiment 2.

In Embodiment 2, a capacitor is further added to sampling switch 130 in parallel to integration units 150-1 through 150-8 in the configuration of sampling filter apparatus 100 of Embodiment 1 (see FIG. 9). By this means, a filter characteristic in which a first-order IIR filter characteristic and 4-tap FIR filter characteristic are combined is implemented.

The operation of sampling filter apparatus 200 having the above configuration will now be described. It is assumed here that capacitors 1501, 1502, 1505, and 1506 have the same capacity (=$C_1$), and capacitors 1500, 1510, 1503, 1513, 1504, 1514, 1507, and 1517 have the same capacity (=$C_1/2$). A case in which the same kind of control as shown in FIG. 3 is performed will be described here.

At timing 1, charge switches 1700 and 1710 of integration unit 150-1 are turned on. When sampling switch 130 is turned on at this time, voltage-to-current converter 120, capacitor 2110, capacitor 1500, and capacitor 1510 are connected. A charge ($Q_{1201}^1$) input from voltage-to-current converter 120 and a charge ($Q_{2110}^0$) already charged in capacitor 2110 are then shared by capacitor 2110, capacitor 1500, and capacitor 1510. Then a $Q_{2110}^1$ charge is charged in capacitor 2110, a $Q_{1500}^1$ charge is charged in capacitor 1500, and a $Q_{1510}^1$ charge is charged in capacitor 1510. At timing 1, also, charge transfer processing is performed in integration unit 150-8.

At timing 2, charge switch 1701 of integration unit 150-2 is turned on. When sampling switch 130 is turned on at this time, voltage-to-current converter 120, capacitor 2110, and capacitor 1501 are connected. A charge ($Q_{120}^2$) input from voltage-to-current converter 120 and a charge ($Q_{2110}^1$) already charged in capacitor 2110 are then shared by capacitor 2110 and capacitor 1501, a $Q_{2110}^2$ charge is charged in capacitor 2110, and a $Q_{1501}^2$ charge is charged in capacitor 1501.

Also, at timing 2, charge transfer processing is performed in integration unit 150-1. At timing 2, also, discharge switches 1804, 1805, 1806, and 1807 are turned on. By this means, charges charged in capacitors 1504, 1505, 1506, and 1507 in integration units 150-4 through 150-8 are emitted.

At timing 3, charge switch 1702 of integration unit 150-3 is turned on. When sampling switch 130 is turned on at this time, voltage-to-current converter 120, capacitor 2110, and capacitor 1502 are connected. A charge ($Q_{120}^3$) input from voltage-to-current converter 120 and a charge ($Q_{2110}^2$) already charged in capacitor 2110 are then shared by capacitor 2110 and capacitor 1502, a $Q_{2110}^3$ charge is charged in capacitor 2110, and a $Q_{1502}^3$ charge is charged in capacitor 1502.

At timing 4, charge switches 1703 and 1713 of integration unit 150-4 are turned on. When sampling switch 130 is turned on at this time, voltage-to-current converter 120, capacitor 2110, capacitor 1503, and capacitor 1513 are connected. A charge ($Q_{120}^4$) input from voltage-to-current converter 120 and a charge ($Q_{2110}^3$) already charged in capacitor 2110 are then shared by capacitor 2110, capacitor 1503, and capacitor 1513, a $Q_{2110}^4$ charge is charged in capacitor 2110, a $Q_{1503}^4$ charge is charged in capacitor 1503, and a $Q_{1513}^4$ charge is charged in capacitor 1513.

At timing 5, charge switches 1704 and 1714 of integration unit 150-5 are turned on. When sampling switch 130 is turned on at this time, voltage-to-current converter 120, capacitor 2110, capacitor 1504, and capacitor 1514 are connected. A charge ($Q_{120}^5$) input from voltage-to-current converter 120 and a charge ($Q_{2110}^4$) already charged in capacitor 2110 are then shared by capacitor 2110, capacitor 1504, and capacitor 1514, a $Q_{2110}^5$ charge is charged in capacitor 2110, a $Q_{1504}^5$ charge is charged in capacitor 1504, and a $Q_{1514}^5$ charge is charged in capacitor 1514. At timing 5, also, charge transfer processing is performed in integration unit 150-4.

At timing 6, charge switch 1705 of integration unit 150-6 is turned on. When sampling switch 130 is turned on at this time, voltage-to-current converter 120, capacitor 2110, and capacitor 1505 are connected. A charge ($Q_{120}^6$) input from voltage-to-current converter 120 and a charge ($Q_{2110}^5$) already charged in capacitor 2110 are then shared by capacitor 2110 and capacitor 1505, a $Q_{2110}^6$ charge is charged in capacitor 2110, and a $Q_{1505}^6$ charge is charged in capacitor 1505.

Also, at timing 6, charge transfer processing is performed in integration unit 150-5. At timing 6, also, discharge switches 1800, 1801, 1802, and 1803 are turned on. By this means, charges charged in capacitors 1500, 1501, 1502, and 1503 in integration units 150-1 through 150-4 are emitted.

At timing 7, charge switch 1706 of integration unit 150-7 is turned on. When sampling switch 130 is turned on at this time, voltage-to-current converter 120, capacitor 2110, and capacitor 1506 are connected. A charge ($Q_{120}^7$) input from voltage-to-current converter 120 and a charge ($Q_{2110}^6$) already charged in capacitor 2110 are then shared by capacitor 2110 and capacitor 1506, a $Q_{2110}^7$ charge is charged in capacitor 2110, and a $Q_{1506}^7$ charge is charged in capacitor 1506.

At timing 8, charge switches 1707 and 1717 of integration unit 150-8 are turned on. When sampling switch 130 is turned on at this time, voltage-to-current converter 120, capacitor 2110, capacitor 1507, and capacitor 1517 are connected. A charge ($Q_{120}^8$) input from voltage-to-current converter 120 and a charge ($Q_{2110}^7$) already charged in capacitor 2110 are then shared by capacitor 2110, capacitor 1507, and capacitor 1517, a $Q_{2110}^8$ charge is charged in capacitor 2110, a $Q_{1507}^8$ charge is charged in capacitor 1507, and a $Q_{1517}^8$ charge is charged in capacitor 1517. At timing 9 onward, the processing of timings 1 through 8 is repeated.

Here, if the capacity of capacitor 2110 is designated $C_2$, the transfer function of sampling filter apparatus 200 at this time is represented by the product of Equation (2) below and Equation (1) above.

[2]

$$x = \frac{\frac{C_1}{C_1 + C_2}}{1 - \frac{C_1}{C_1 + C_2}Z^{-1}} \quad \text{(Equation 2)}$$

Figure 10:
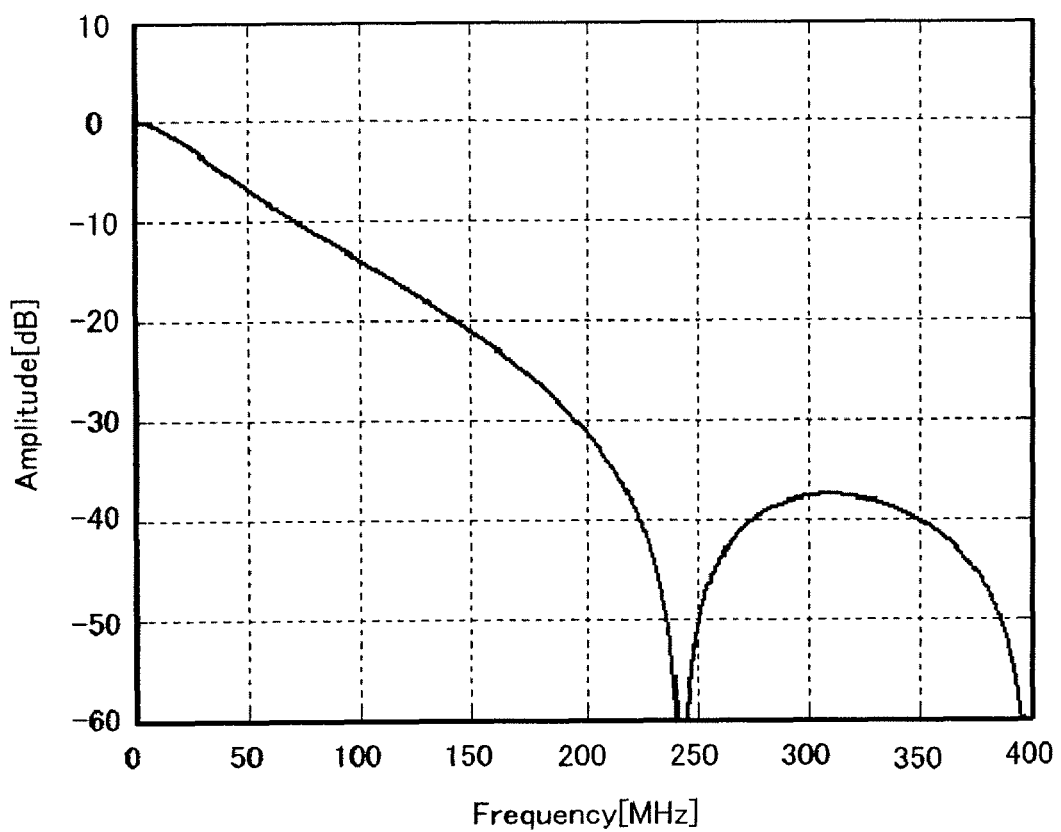
FIG. 10 is a graph showing a filter characteristic implemented by the sampling filter apparatus in FIG. 9.

In FIG. 10, an example of a filter characteristic is shown by the solid line. Specifically, a filter characteristic when 1/T is 800 [MHz], a is 0.6, and $C_2=4 \times C_1$ is shown.

From the above, when the charge transfer amount is changed, a changes. That is to say, it is possible to change the filter characteristic by changing the charge transfer amount. The charge transfer amount can be changed by adjusting an MEMS control amount to change the capacity ratio between capacitors connected in parallel, and the ratio between the capacity of these capacitors and the capacity of capacitor 2110.

The relationship between $C_1$ and $C_2$ can be changed by giving capacitor 2110 an MEMS structure. It is also possible to implement a configuration whereby a filter characteristic is changed by this means.

As described above, according to this embodiment, sampling filter apparatus 200 enables a sampling filter apparatus having a first-order IIR filter characteristic to be implemented by providing capacitor 2110 in parallel to integration units 150-1 through 150-8.

Embodiment 3

Figure 11:
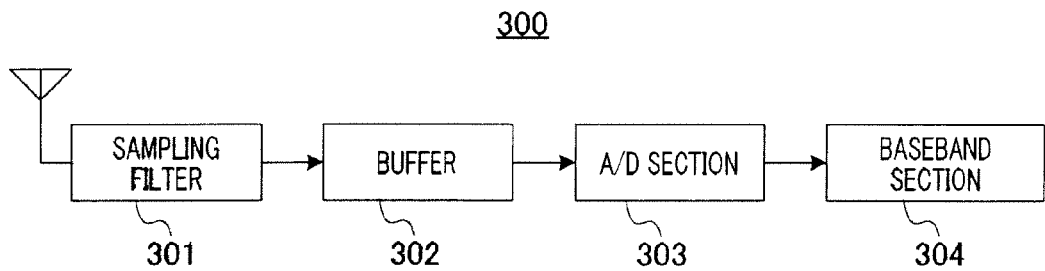
FIG. 11 is a block diagram showing the configuration of a radio communication apparatus of Embodiment 3.

FIG. 11 is a block diagram showing the configuration of a radio communication apparatus according to Embodiment 3 of the present invention. In FIG. 11, radio communication apparatus 300 has sampling filter 301, Buffer 302, A/D section 303, and baseband section 304.

Sampling filter 301 has the same configuration as sampling filter apparatus 100 according to Embodiment 1. Like sampling filter apparatus 100, sampling filter 301 performs discretization and filter processing on an input received signal.

Buffer 302 outputs the voltage values across capacitors 1500 through 1507 of sampling filter 301.

Buffer 302 can be composed of operational amplifier 5000 and capacitor 2120 as shown in FIG. 12, for example. Buffer 302 also has reset switch 1900 that is turned on and off by a control signal from controller 140.

The operation of radio communication apparatus 300 having the above configuration will now be described.

When discharge switches 1800, 1801, 1802, and 1803 of sampling filter 301 are on, capacitors 1500, 1501, 1502, and 1503, and capacitor 2120, are connected. A charge charged in capacitors 1500, 1501, 1502, and 1503 is then shared by capacitors 1500, 1501, 1502, and 1503, and capacitor 2120. At this time, a voltage in accordance with the total charge amount accumulated in capacitors 1500, 1501, 1502, and 1503 occurs across capacitor 2120. The voltage value across capacitor 2120 is output from operational amplifier 5000.

When discharge switches 1800, 1801, 1802, and 1803 are turned off, reset switch 1900 is turned on, and the charge accumulated in capacitor 2120 is reset.

When discharge switches 1804, 1805, 1806, and 1807 are on, capacitors 1504, 1505, 1506, and 1507, and capacitor 2120, are connected. A charge charged in capacitors 1504, 1505, 1506, and 1507 is then shared by capacitors 1504, 1505, 1506, and 1507, and capacitor 2120. At this time, a voltage in accordance with the total charge amount accumulated in capacitors 1504, 1505, 1506, and 1507 occurs across capacitor 2120. The voltage value across capacitor 2120 is output from operational amplifier 5000.

When discharge switches 1804, 1805, 1806, and 1807 are turned off, reset switch 1900 is turned on, and the charge accumulated in capacitor 2120 is reset.

The voltage value output from Buffer 302 at this time is a discretized analog signal.

A/D section 303 has a discretized analog signal output from Buffer 302 as input, and digitalizes that analog signal.

Baseband section 304 performs digital signal processing on a digital signal received from A/D section 303.

According to this embodiment, it is possible to implement a radio communication apparatus equipped with a sampling filter apparatus that can change a filter characteristic flexibly.

Embodiment 4

Figure 13:
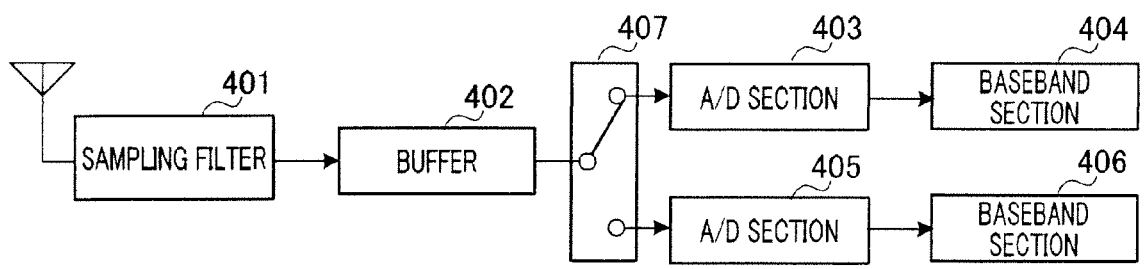
FIG. 13 is a block diagram showing the configuration of a radio communication apparatus of Embodiment 4.

FIG. 13 is a block diagram showing the configuration of a radio communication apparatus according to Embodiment 4 of the present invention. In FIG. 13, radio communication apparatus 400 has sampling filter 401, Buffer 402, first A/D section 403, first baseband section 404, second A/D section 405, second baseband section 406, and switch 407.

Sampling filter 401 has the same configuration as sampling filter apparatus 100 according to Embodiment 1. Like sampling filter apparatus 100, sampling filter 401 performs discretization and filter processing on an input received signal. Also, sampling filter 401 can change a filter characteristic due to the fact that some capacitors have an MEMS structure. In this embodiment, the filter characteristic of sampling filter 401 is changed according to the radio communication method applied in radio communication apparatus 400.

Buffer 402 has the same kind of function as Buffer 302, outputting a voltage value in accordance with a charge amount emitted from capacitors 1500 through 1507 of sampling filter 401.

First A/D section 403 has a discretized analog signal output from Buffer 402 as input, and digitalizes that analog signal according to conditions appropriate to a first radio communication method.

First baseband section 404 performs digital signal processing corresponding to the first radio communication method on a digital signal received from first A/D section 403.

Second A/D section 405 has a discretized analog signal output from Buffer 402 as input, and digitalizes that analog signal according to conditions appropriate to a second radio communication method.

Second baseband section 406 performs digital signal processing corresponding to the second radio communication method on a digital signal received from second A/D section 405.

Switch 407 switches the connection state of Buffer 402 to first A/D section 403 or second A/D section 405 according to the radio communication method applied in radio communication apparatus 400. Specifically, when a first radio communication method is applied, switch 407 switches to a state in which Buffer 402 and first A/D section 403 are connected, and when a second radio communication method is applied, switch 407 switches to a state in which Buffer 402 and second A/D section 405 are connected.

According to this embodiment, a radio communication apparatus can be implemented that enables a filter characteristic to be adjusted according to an applied radio communication method. In addition, the above first wireless communication method and the second wireless communication method are not limited to a specific method.

Embodiment 5

In Embodiments 1 and 2, a sampling filter apparatus that performs decimation was described. In contrast, in this embodiment, a sampling filter apparatus that does not perform decimation will be described.

Figure 14:
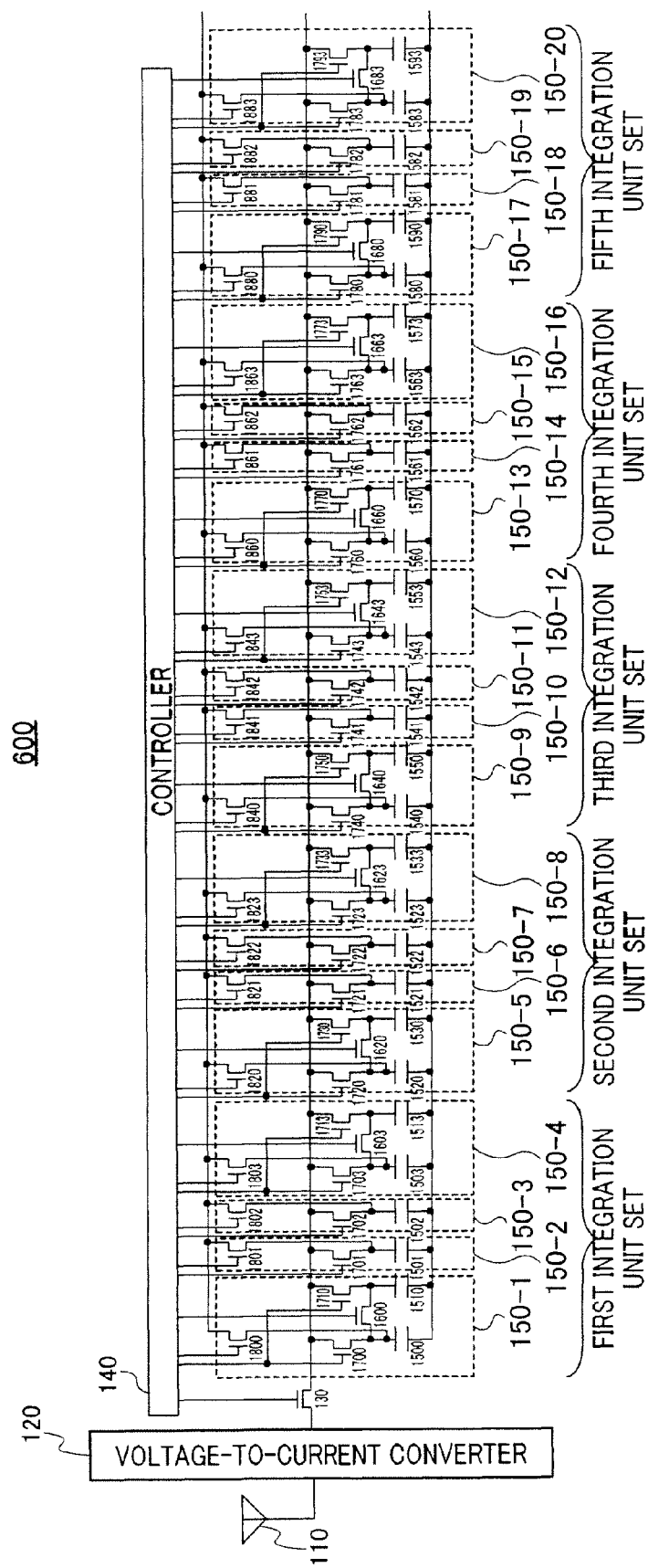
FIG. 14 is a block diagram showing the configuration of a sampling filter apparatus according to Embodiment 5.

FIG. 14 shows the configuration of a sampling filter apparatus according to this embodiment.

In FIG. 14, sampling filter apparatus 600 has five sets of integration units, each comprising four integration units. That is to say, sampling filter apparatus 600 has a first integration unit set comprising integration units 150-1 through 150-4, a second integration unit set comprising integration units 150-5 through 150-8, a third integration unit set comprising integration units 150-9 through 150-12, a fourth integration unit set comprising integration units 150-13 through 150-16, and a fifth integration unit set comprising integration units 150-17 through 150-20.

In FIG. 14, integration unit 150-5 has capacitors 1520 and 1530, charge transfer switch 1620, charge switches 1720 and 1730, and discharge switch 1820. Integration unit 150-6 has capacitor 1521, charge switch 1721, and discharge switch 1821. Integration unit 150-7 has capacitor 1522, charge switch 1722, and discharge switch 1822. Integration unit 150-8 has capacitors 1523 and 1533, charge transfer switch 1623, charge switches 1723 and 1733, and discharge switch 1823.

Integration unit 150-9 has capacitors 1540 and 1550, charge transfer switch 1640, charge switches 1740 and 1750, and discharge switch 1840. Integration unit 150-10 has capacitor 1541, charge switch 1741, and discharge switch 1841. Integration unit 150-11 has capacitor 1542, charge switch 1742, and discharge switch 1842. Integration unit 150-12 has capacitors 1543 and 1553, charge transfer switch 1643, charge switches 1743 and 1753, and discharge switch 1843.

Integration unit 150-13 has capacitors 1560 and 1570, charge transfer switch 1660, charge switches 1760 and 1770, and discharge switch 1860. Integration unit 150-14 has capacitor 1561, charge switch 1761, and discharge switch 1861. Integration unit 150-15 has capacitor 1562, charge switch 1762, and discharge switch 1862. Integration unit 150-16 has capacitors 1563 and 1573, charge transfer switch 1663, charge switches 1763 and 1773, and discharge switch 1863.

Integration unit 150-17 has capacitors 1580 and 1590, charge transfer switch 1680, charge switches 1780 and 1790, and discharge switch 1880. Integration unit 150-18 has capacitor 1581, charge switch 1781, and discharge switch 1881. Integration unit 150-19 has capacitor 1582, charge switch 1782, and discharge switch 1882. Integration unit 150-20 has capacitors 1583 and 1593, charge transfer switch 1683, charge switches 1783 and 1793, and discharge switch 1883.

Figure 15:
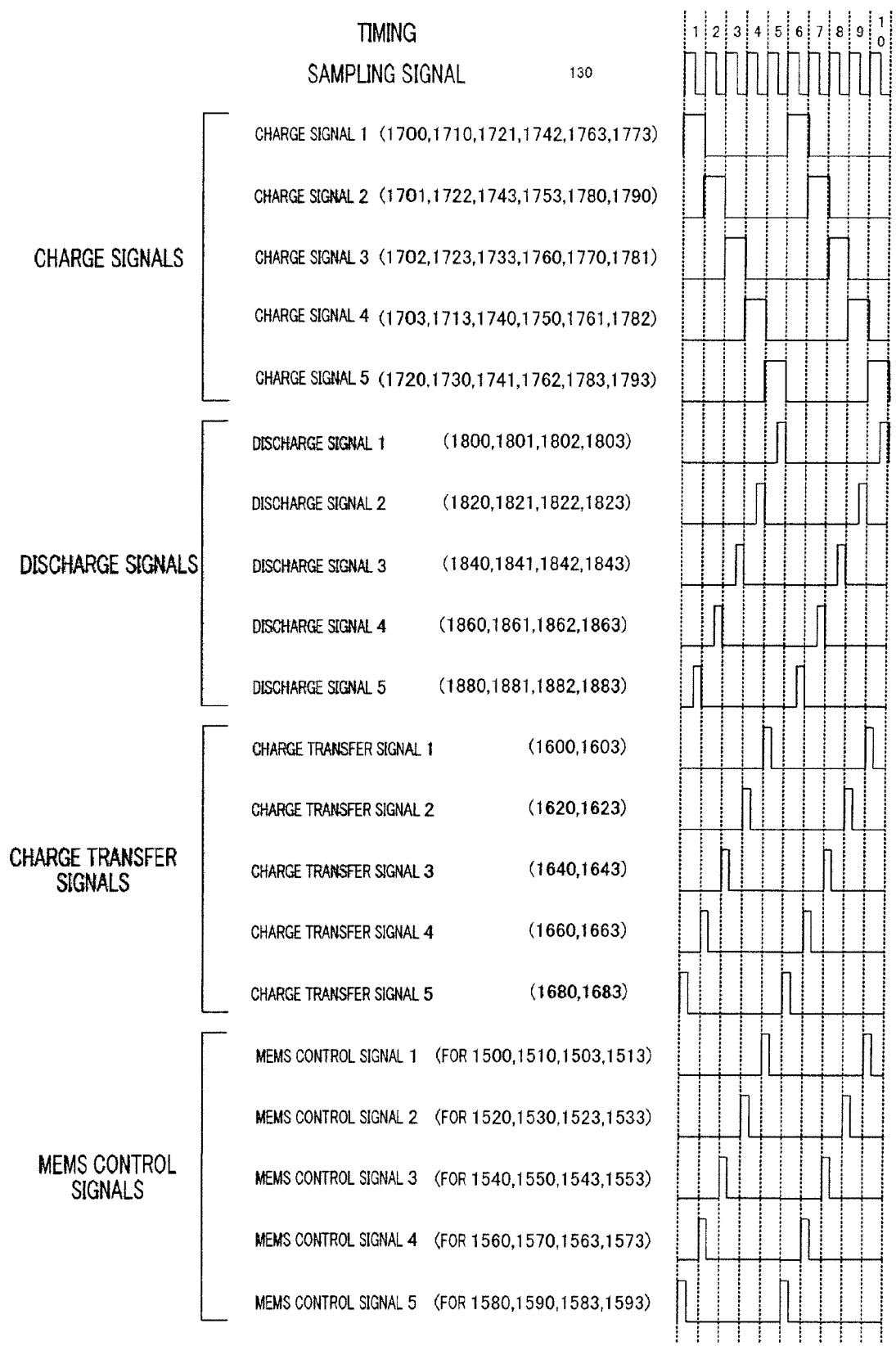
FIG. 15 is a timing chart of control signals generated by the controller in FIG. 14.

Like FIG. 3, FIG. 15 is a timing chart of control signals generated by controller 140. That is to say, FIG. 15 shows control signals for each switch, and the on and off timings of each switch. The timing chart example shown here is for a case in which sampling filter apparatus 600 has a fourth-order FIR filter characteristic and does not perform decimation.

In FIG. 15, charge signal 1 is supplied to charge switches 1700, 1710, 1721, 1742, 1763, and 1773. Charge signal 2 is supplied to charge switches 1701, 1722, 1743, 1753, 1780, and 1790. Charge signal 3 is supplied to charge switches 1702, 1723, 1733, 1760, 1770, and 1781. Charge signal 4 is supplied to charge switches 1703, 1713, 1740, 1750, 1761, and 1782. Charge signal 5 is supplied to charge switches 1720, 1730, 1742, 1762, 1783, and 1793.

Discharge signal 1 is supplied to discharge switches 1800 through 1803. Discharge signal 2 is supplied to discharge switches 1820 through 1823. Discharge signal 3 is supplied to discharge switches 1840 through 1843. Discharge signal 4 is supplied to discharge switches 1860 through 1863. Discharge signal 5 is supplied to discharge switches 1880 through 1883.

Charge transfer signal 1 is supplied to charge transfer switches 1600 and 1603. Charge transfer signal 2 is supplied to charge transfer switches 1620 and 1623. Charge transfer signal 3 is supplied to charge transfer switches 1640 and 1643. Charge transfer signal 4 is supplied to charge transfer switches 1660 and 1663. Charge transfer signal 5 is supplied to charge transfer switches 1680 and 1683.

MEMS control signal 1 is supplied to integration units 150-1 and 150-4. MEMS control signal 2 is supplied to integration units 150-5 and 150-8. MEMS control signal 3 is supplied to integration units 150-9 and 150-12. MEMS control signal 4 is supplied to integration units 150-13 and 150-16. MEMS control signal 5 is supplied to integration units 150-17 and 150-20.

The first integration unit set charges capacitors at timings 1 through 4, and performs discharging after performing MEMS control and charge transfer at timing 5. The fifth integration unit set charges capacitors at timings 2 through 5, and performs discharging after performing MEMS control and charge transfer at timing 6. The fourth integration unit set charges capacitors at timings 3 through 6, and performs discharging after performing MEMS control and charge transfer at timing 7. The third integration unit set charges capacitors at timings 4 through 7, and performs discharging after performing MEMS control and charge transfer at timing 3. The second integration unit set charges capacitors at timings 5 through 8, and performs discharging after performing MEMS control and charge transfer at timing 9.

FIG. 16 is a drawing showing charge timings for the capacitors of sampling filter apparatus 600. In FIG. 16, one of two capacitors contained in the same integration unit is omitted.

As shown in FIG. 16, in each integration unit set, charging is performed at four timings of five consecutive timings. Then discharging is performed after MEMS control and charge transfer are performed at the remaining one timing. Here, it is necessary to perform MEMS control, charge transfer, and discharging at one timing. A frequency component of twice the frequency of a discharge signal is therefore necessary for an MEMS control signal, charge transfer signal, and discharge signal.

The above remaining one timing is visited by the first integration unit set through fifth integration unit set in turn, shifting the timing. That is to say, at any timing, one integration unit set among the first integration unit set through fifth integration unit is discharging. Therefore, sampling filter apparatus 600 can output a signal that has not been decimated. With sampling filter apparatus 100 of Embodiment 1, with regard to discharge timing, this is equivalent to first integration unit set timing 1 through 5 and second integration unit set timing 5 through 9 operations being performed alternately, and a 4-decimated filter characteristic is obtained.

Thus, according to this embodiment, sampling filter apparatus 600 is provided with five integration unit sets, each comprising four integration units corresponding to four taps respectively. In each integration unit set, the four integration units charge in turn at four timings of five consecutive timings, and discharge together at the remaining one timing. This discharge timing differs for each of the five integration unit sets. That is to say, four integration units discharge in turn at mutually shifted timings.

The frequency of an MEMS control signal, charge transfer signal, and discharge signal, and the frequency of a charge signal, can also be made the same. In this case, a sampling filter apparatus has six integration unit sets, each comprising four integration units 150. This enables one timing each to be assigned to an MEMS control signal, charge transfer signal, and discharge signal.

The actual control is as follows. The first integration unit set charges capacitors at timings 1 through 4, performs MEMS control and charge transfer at timing 5, and performs discharging at timing 6 (from timing 7 onward, timings 1 through 6 are repeated). The sixth integration unit set charges capacitors at timings 2 through 5, performs MEMS control and charge transfer at timing 6, and performs discharging at timing 7 (from timing 8 onward, timings 2 through 7 are repeated). The fifth integration unit set charges capacitors at timings 3 through 6, performs MEMS control and charge transfer at timing 7, and performs discharging at timing 8 (from timing 9 onward, timings 3 through 8 are repeated). The fourth integration unit set charges capacitors at timings 4 through 7, performs MEMS control and charge transfer at timing 8, and performs discharging at timing 9 (from timing 10 onward, timings 4 through 9 are repeated). The third integration unit set charges capacitors at timings 5 through 8, performs MEMS control and charge transfer at timing 9, and performs discharging at timing 10 (from timing 11 onward, timings 5 through 10 are repeated). The second integration unit set charges capacitors at timings 6 through 9, performs MEMS control and charge transfer at timing 10, and performs discharging at timing 11 (from timing 12 onward, timings 6 through 11 are repeated).

To summarize the above, a sampling filter apparatus is provided with at least m+1 integration unit sets, each comprising m integration units corresponding to m taps (where m is a natural number) respectively, and the m+1 integration unit sets emit integrated received signals in turn at mutually shifted timings.

Thus, at any timing, one integration unit set among the first integration unit set through m'th integration unit is discharging, and therefore a sampling filter apparatus can obtain a filter characteristic for which decimation is not performed.

An above-described configuration that does not perform decimation can also be applied to sampling filter apparatus 200 of Embodiment 2 shown in FIG. 9.

Other Embodiments (1) In Embodiment 2, adjustment of a filter characteristic in which a first-order IIR filter characteristic and 4-tap FIR filter characteristic are combined is implemented by means of charge transfer processing. On the other hand, a filter characteristic can also be adjusted by giving capacitor 2110 an MEMS structure as shown in FIG. 17.

Figure 17:
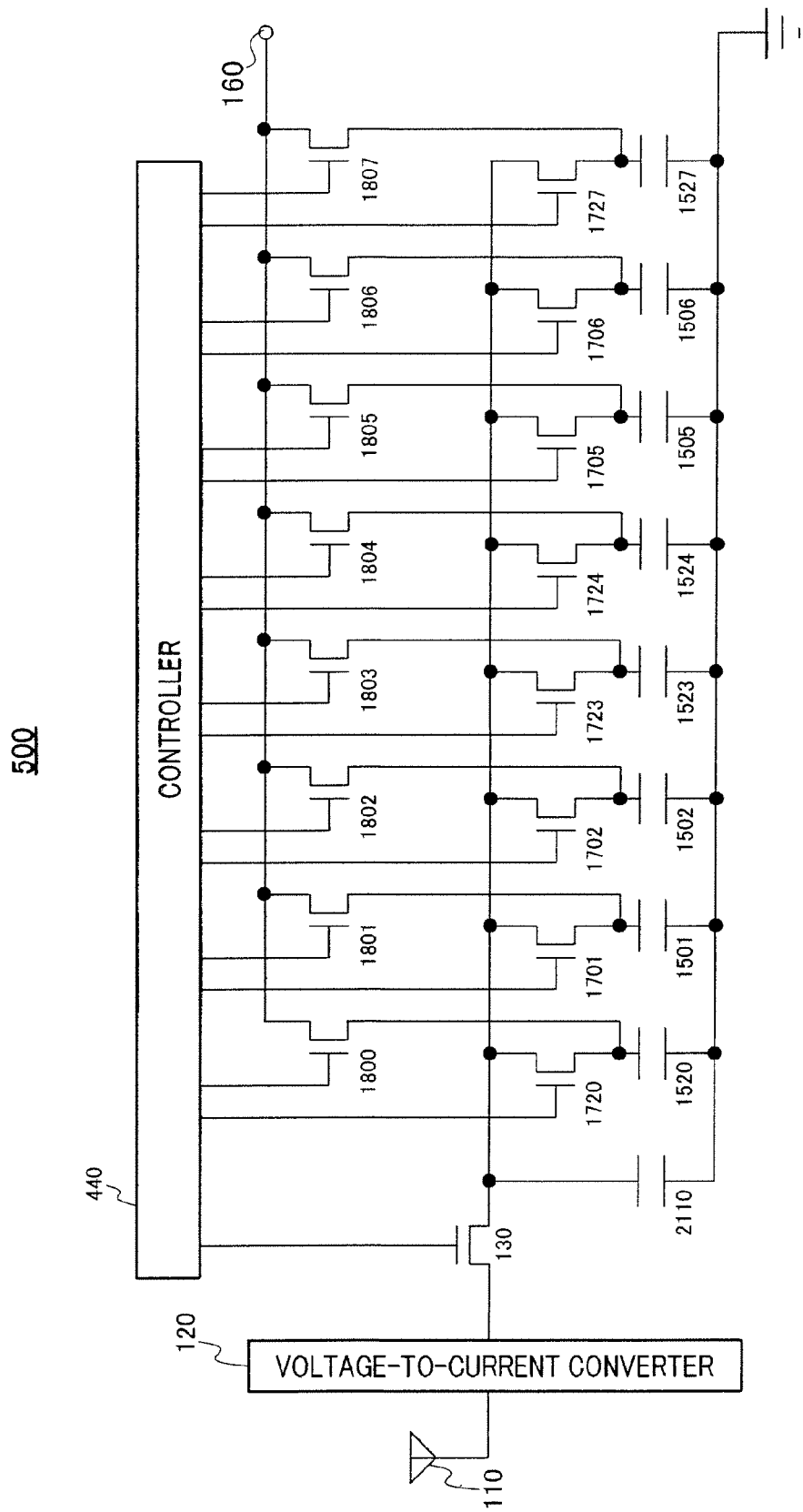
FIG. 17 is a block diagram showing the configuration of a sampling filter apparatus of another embodiment.

As shown in FIG. 17, sampling filter apparatus 500 has capacitor 2110. The capacity of this capacitor 2110 is $C_2$. Sampling filter apparatus 500 also has capacitors 1501, 1502, 1505, 1506, 1520, 1523, 1524, and 1527. The capacity of each of capacitors 1501, 1502, 1505, 1506, 1520, 1523, 1524, and 1527 is $C_1$. Capacitors 1501, 1502, 1505, 1506, 1520, 1523, 1524, and 1527 are arranged in parallel.

That is to say, as compared with above-described sampling filter apparatus 200, sampling filter apparatus 500 has capacitors 1520, 1523, 1524, and 1527 with the same capacity as capacitors 1501, 1502, 1505, and 1506, instead of capacitors 1500, 1510, 1503, 1513, 1504, 1514, 1507, and 1517.

Figure 18:
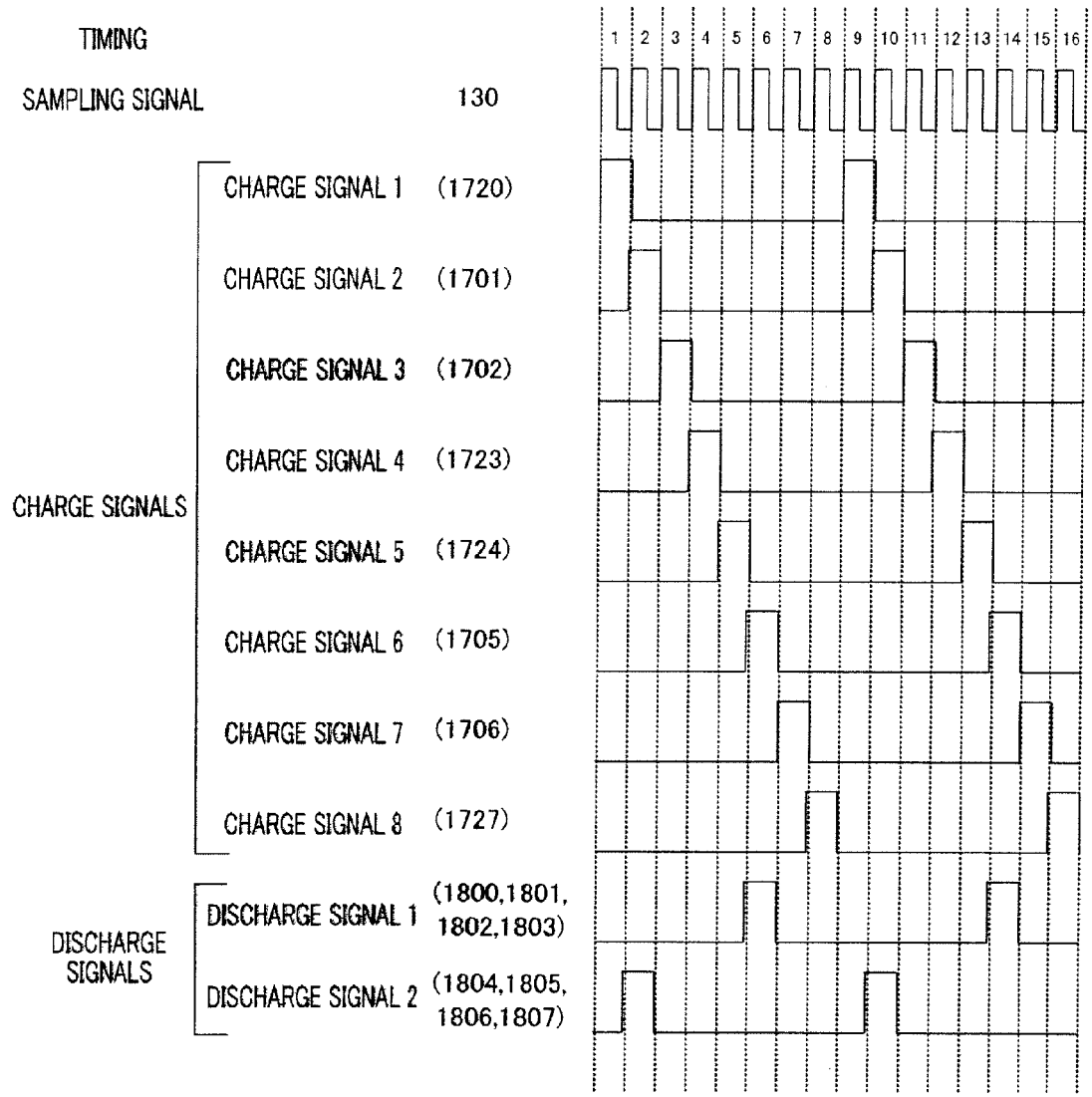
FIG. 18 is a timing chart of control signals by which a sampling filter apparatus of another embodiment is controlled.

When sampling filter apparatus 500 having this configuration is controlled by the control signals shown in FIG. 18, sampling filter apparatus 500 performs the same operation as sampling filter apparatus 200, except for charge transfer processing.

That is to say, capacitors 1520, 1501, 1502, and 1523 are connected in turn to capacitor 2110 by charge switches 1720, 1701, 1702, and 1723 being successively turned on based on charge signals 1 through 4, and share a charge with capacitor 2110.

Also, capacitors 1524, 1505, 1506, and 1527 are connected in turn to capacitor 2110 by charge switches 1724, 1705, 1706, and 1727 being successively turned on based on charge signals 5 through 8, and share a charge with capacitor 2110.

In the period in which capacitors 1524, 1505, 1506, and 1527 are accumulating a charge in turn, capacitors 1520, 1501, 1502, and 1523 simultaneously emit an already accumulated charge.

According to the configuration and operation of sampling filter apparatus 500 described above, since the capacitors all have the same capacity, a of a transfer function indicating a FIR filter characteristic is fixed at 1.0. However, the relationship between $C_1$ and $C_2$ can be changed by adjusting the capacity of capacitor 2110 having an MEMS structure, enabling the filter characteristic to be changed.

(2) The filter characteristic can also be changed in sampling filter apparatus 500 if, conversely, the capacity of capacitor 2110 is fixed, and capacitors 1501, 1502, 1505, 1506, 1520, 1523, 1524, and 1527 have an MEMS structure. This is because the relationship between $C_1$ and $C_2$ can be changed by adjusting the capacity of capacitors 1501, 1502, 1505, 1506, 1520, 1523, 1524, and 1527 having an MEMS structure.

INDUSTRIAL APPLICABILITY

A discrete filter radio communication apparatus of the present invention is useful in enabling a filter characteristic to be adjusted flexibly.

What is claimed is:

1. A sampling filter that implements an m-tap (where m is a natural number) FIR filter characteristic by having a received signal as input and integrating and emitting an input received signal, the sampling filter including m integration units corresponding to the m taps,
    wherein at least some integration units of the m integration units include a first integrator having an MEMS (Micro Electro-Mechanical Systems) structure, and a second integrator connected in parallel to the first integrator.
2. The sampling filter according to claim 1, wherein:
    the first integrator comprises a capacity value adjusted by the MEMS structure.
3. The sampling filter according to claim 1, wherein:
    the first integrator and the second integrator each integrate a received signal; and
    either the first integrator or the second integrator transfers part of a received signal integrated by either the first integrator or the second integrator to the other one of the first integrator or the second integrator, and emits a received signal remaining in the second integrator after the transfer.

4. The sampling filter according to claim 3, further comprising a switch that is provided between the first integrator and the second integrator and switches a conduction state between both integrators,
   wherein the switch establishes an on state (conduction) between both integrators when the integrated received signal is transferred, and establishes an off state (non-conduction) between both integrators after transfer of the integrated received signal and before emission of the remaining received signal.

5. The sampling filter according to claim 2, further comprising a switch that is provided between the first integrator and the second integrator and switches a conduction state between both integrators,
   wherein the switch establishes an on state (conduction) between both integrators when the integrated received signal is transferred, and establishes an off state (non-conduction) between both integrators after transfer of the integrated received signal and before emission of the remaining received signal.

6. A radio communication apparatus comprising:
   the sampling filter according to claim 1;
   a buffer that converts a received signal integrated by the sampling filter to a voltage value, and outputs that voltage value;
   an A/D section that digitalizes an analog signal output from the Buffer; and
   a baseband section that performs demodulation processing on a signal digitalized by the A/D section.

7. A radio communication apparatus capable of supporting a plurality of radio communication methods, the radio communication apparatus comprising:
   the sampling filter according to claim 1; and
   a baseband processing section that performs baseband processing of an output signal of the sampling filter according to the plurality of radio communication methods.

8. A sampling filter comprising:
   a control signal generation section that generates a plurality of control signals having a same frequency and different phases; and
   2m (where m is a natural number) integration units that integrate a received signal, wherein:
   the 2m integration units integrate the received signal at mutually different timings based on the plurality of control signals; and
   the 2m integration units are divided into two groups according to timing at which an integrated received signal is emitted, and emit the integrated received signal so that at least part of a period in which the received signal is integrated in m integration units composing one group selected from the two groups and a period in which a received signal integrated in a period before the period is emitted from m integration units composing another group other than the selected one group coincide temporally;
   some integration units among in integration units belonging to the two groups have: a first integrator that integrates a received signal;
   a second integrator connected in parallel to the first integrator; and
   a switch that is provided between the first integrator and the second integrator and switches a conduction state between both integrators, wherein:
   at least one of the two integrators has an MEMS (Micro Electro-Mechanical Systems) structure; and
   after a received signal has been integrated by the two integrators, the integrated received signal is transferred between the two integrators by turning the switch to an on state and changing a capacity value of an integrator having an MEMS structure of the two integrators, and furthermore a received signal remaining in the first integrator is emitted after the switch has been switched from an on state to an off state.

* * * * *